(12) United States Patent
Mi

(10) Patent No.: US 8,947,399 B2
(45) Date of Patent: *Feb. 3, 2015

(54) DUAL-SUBSTRATE CAPACITIVE TOUCH PANEL

(71) Applicant: TPK Touch Solutions Inc., Taipei (TW)

(72) Inventor: David Mi, Taoyuan (TW)

(73) Assignee: TPK Touch Solutions Inc., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/920,052

(22) Filed: Jun. 17, 2013

(65) Prior Publication Data

US 2013/0277197 A1    Oct. 24, 2013

Related U.S. Application Data

(63) Continuation-in-part of application No. 12/803,763, filed on Jul. 6, 2010, now Pat. No. 8,487,904.

(30) Foreign Application Priority Data

May 11, 2010    (TW) .............................. 99114885 A

(51) Int. Cl.
    *G06F 3/045*        (2006.01)
    *H03K 17/96*        (2006.01)
    *G06F 3/044*        (2006.01)

(52) U.S. Cl.
    CPC .............. *H03K 17/962* (2013.01); *G06F 3/044* (2013.01); *G06F 2203/04103* (2013.01)
    USPC ....................................................... 345/174

(58) Field of Classification Search
    CPC ...... H03K 17/962; H03K 17/96; G06F 3/044; G06F 2203/04103

USPC .............. 345/174, 173, 179, 157; 178/18.01, 178/18.06

See application file for complete search history.

(56) References Cited

U.S. PATENT DOCUMENTS

| 8,487,904 B2 * | 7/2013 | Mi ................................ 345/174 |
| 2002/0011992 A1 | 1/2002 | Muraoka et al. |

(Continued)

FOREIGN PATENT DOCUMENTS

| JP | 2008250309 | 10/2008 |
| JP | 2009216978 | 9/2009 |

(Continued)

*Primary Examiner* — Chanh Nguyen
*Assistant Examiner* — Tsegaye Seyoum
(74) *Attorney, Agent, or Firm* — Gokalp Bayramoglu

(57) ABSTRACT

A capacitive touch panel sequentially has a first transparent substrate, a lower touch sensitive layer, a lower conductor layer, a lower insulation layer, a lower conductive adhesive layer, a flexible circuit board, a transparent insulation adhesive layer, an upper insulation layer, an upper conductive adhesive layer, an upper conductor layer, an upper insulation ink layer, an upper touch sensitive layer and a second transparent substrate. The aforementioned structure allows fabrication of the capacitive touch panel to be separated into a lower panel fabrication process and an upper panel fabrication process. The two independent fabrication processes prevent the capacitive touch panel from being damaged in one of the processes when the process is completed, thereby increase the yield in production and further facilitate producing large-size touch panel.

30 Claims, 6 Drawing Sheets

(56) References Cited

U.S. PATENT DOCUMENTS

| | | |
|---|---|---|
| 2005/0030048 A1 | 2/2005 | Bolender et al. |
| 2005/0046622 A1 | 3/2005 | Nakanishi et al. |
| 2009/0001999 A1 | 1/2009 | Douglas |
| 2009/0315856 A1 | 12/2009 | Oikawa et al. |
| 2009/0321240 A1* | 12/2009 | Huang et al. .............. 200/512 |
| 2010/0006347 A1 | 1/2010 | Yang |
| 2010/0090978 A1 | 4/2010 | Nishikawa et al. |
| 2010/0139955 A1* | 6/2010 | Long et al. ............. 174/257 |
| 2010/0265207 A1* | 10/2010 | Chen ....................... 345/174 |
| 2010/0283755 A1* | 11/2010 | Hsih ........................ 345/174 |
| 2011/0234526 A1 | 9/2011 | Mi |
| 2012/0319966 A1 | 12/2012 | Reynolds |

FOREIGN PATENT DOCUMENTS

| | | |
|---|---|---|
| JP | 2011192124 | 9/2011 |
| KR | 1020110110562 | 10/2011 |
| TW | 200846997 | 12/2008 |
| TW | M348999 | 1/2009 |
| TW | M351407 | 2/2009 |
| TW | M355426 | 4/2009 |
| TW | M356623 | 5/2009 |
| TW | 200947278 | 11/2009 |
| TW | M369502 | 11/2009 |
| TW | 200949341 | 12/2009 |
| TW | M374617 | 2/2010 |
| WO | 2008047971 | 4/2008 |

* cited by examiner

DUAL-SUBSTRATE CAPACITIVE TOUCH PANEL

CROSS-REFERENCE TO RELATED APPLICATIONS

This application is a continuation-in-part of U.S. patent application Ser. No. 12/803,763, filed Jul. 6, 2010, the entire contents of which are incorporated herein by reference.

BACKGROUND OF THE INVENTION

1. Technical Field

The present invention relates to a capacitive touch panel, and more particularly to a capacitive touch panel suitable for manufacturing large-size touch panel.

2. Description of the Related Art

Existing touch panels can be classified as resistive touch panels and capacitive touch panels. Recently, capacitive touch panels become increasingly popular in the touch screen market.

With reference to FIG. 6, a conventional touch panel has a first glass substrate 61, a lower touch sensitive layer 62, an upper touch sensitive layer 63, a flexible circuit board 64, a transparent insulation adhesive layer 65 and a second glass substrate 66. The first glass substrate 61 has a top surface and a bottom surface. The upper touch sensitive layer 63 and the lower touch sensitive layer 62 are respectively formed on the top surface and the bottom surface of the first glass substrate 61. The flexible circuit board 64 is mounted on the top surface of the first glass substrate 61 and is partially and electrically connected to the upper touch sensitive layer 63. The transparent insulation adhesive layer 65 is coated on the first glass substrate 61. The second glass substrate 66 is covered and bonded on the transparent insulation adhesive layer 65.

However, the conventional technology involves separately forming the upper touch sensitive layer 63 and the lower touch sensitive layer 62 on the top and the bottom surfaces of the first glass substrate 61, for example, forming the upper touch sensitive layer 63 first. Hence, when the lower touch sensitive layer 62 is formed subsequently, the completed upper touch sensitive layer 63 easily gets scratched or stained during the fabrication process of the lower touch sensitive layer 62. As a result, the production yield is significantly lowered. Because of the low yield, such capacitive touch panels do not aim for large-size touch panel, thereby further limiting the application range thereof.

BRIEF SUMMARY OF THE INVENTION

In accordance with one embodiment, a capacitive touch panel includes a first substrate, a lower touch sensitive layer, a lower conductor layer, a transparent insulation adhesive layer, an upper conductor layer, an upper insulation ink layer, an upper touch sensitive layer, and a second substrate.

The first substrate has a first circuit surface.

The lower touch sensitive layer is mounted on the first circuit surface of the first substrate.

The lower conductor layer is mounted on the first circuit surface of the first substrate and is electrically connected to the lower touch sensitive layer.

The transparent insulation adhesive layer is mounted on the lower touch sensitive layer.

The upper conductor layer is mounted on the transparent insulation adhesive layer.

The upper insulation ink layer is mounted on the upper conductor layer, and has a plurality of upper through slots formed through the upper insulation ink layer, wherein each of the plurality of upper through slots is filled in with a upper conductive layer.

The upper touch sensitive layer is mounted on the transparent insulation adhesive layer, partially covering the upper insulation ink layer, and is electrically connected to the upper conductor layer via the upper conductive layers in the corresponding upper through slots of the upper insulation ink layer.

The second substrate is mounted on the upper touch sensitive layer and the upper insulation ink layer and has a second circuit surface in contact with the upper touch sensitive layer and the upper insulation ink layer.

Given the above-mentioned structure of the capacitive touch panel, the lower touch sensitive layer and the upper touch sensitive layer respectively are in contact with the first substrate and the second substrate. Upon fabricating the capacitive touch panel, the lower touch sensitive layer and the upper touch sensitive layer can be respectively mounted on the first substrate and the second substrate with different fabrication processes. As using a substrate for fabrication of single-sided circuit layer is a mature technique, the resulting yield in production is relatively high, and the relatively high yield helps build large-size touch panel.

Other objectives, advantages and novel features of the invention will become more apparent from the following detailed description when taken in conjunction with the accompanying drawings.

DETAILED DESCRIPTION

Figure 1:
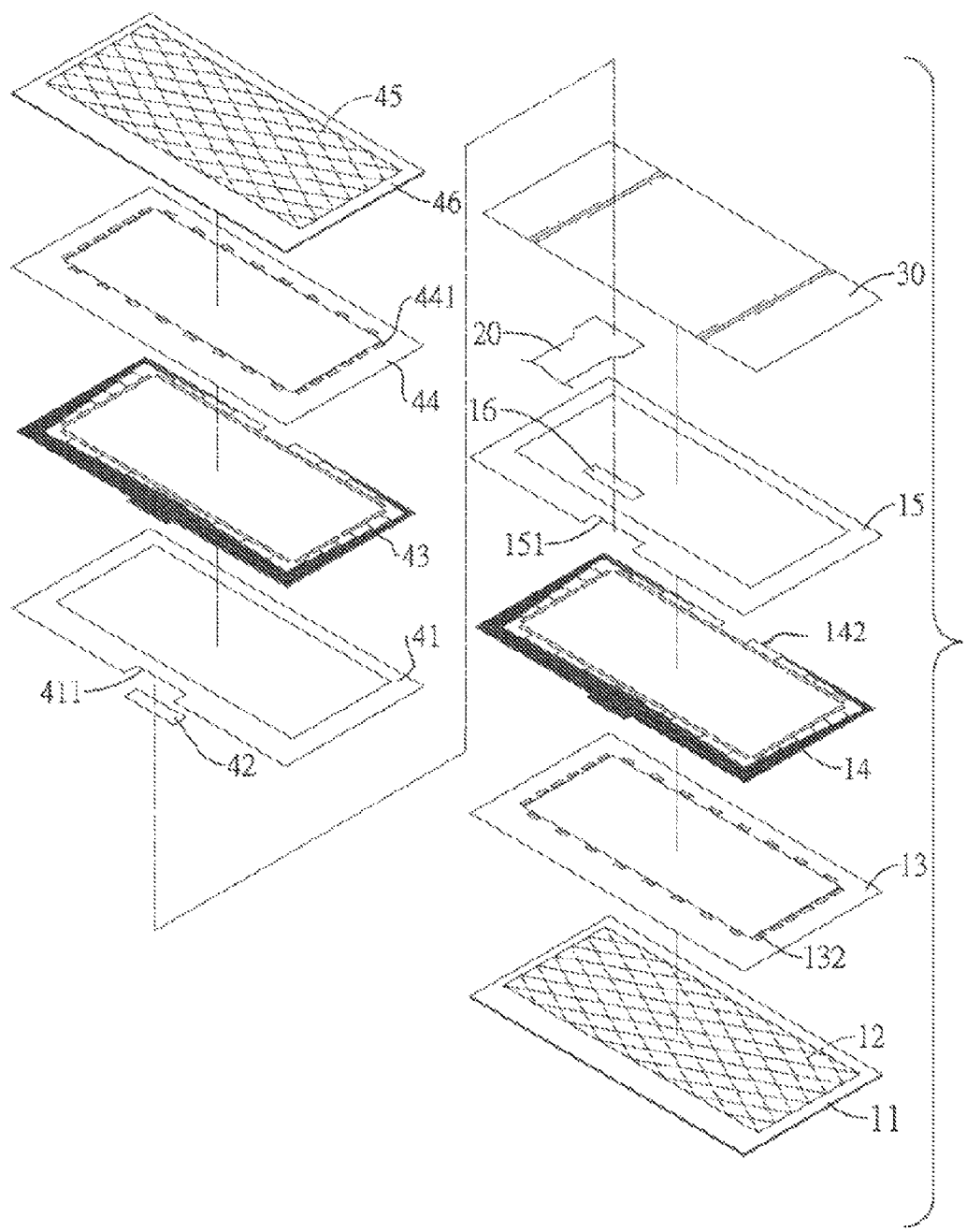
FIG. 1 is an exploded perspective view of a capacitive touch panel in accordance with the first embodiment of the present invention.
Figure 2:
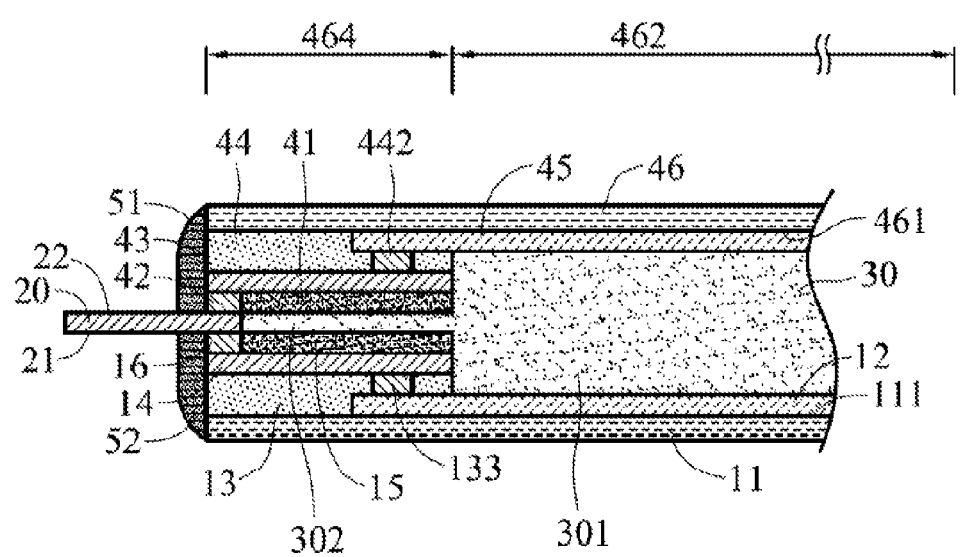
FIG. 2 is a partial cross-sectional view of the capacitive touch panel in FIG. 1.

With reference to FIGS. 1 and 2, a capacitive touch panel according to a first embodiment of the present invention includes a first transparent substrate 11, a lower touch sensitive layer 12, a lower insulation ink layer 13, a lower conductor layer 14, a lower insulation layer 15, a lower conductive adhesive layer 16, a flexible circuit board 20, a transparent insulation adhesive layer 30, an upper insulation layer 41, an upper conductive adhesive layer 42, an upper conductor layer 43, an upper insulation ink layer 44, an upper touch sensitive layer 45, a second transparent substrate 46, an upper protection layer 51 and a lower protection layer 52.

The first transparent substrate 11 has a first circuit surface 111. The lower touch sensitive layer 12, used for sensing touch positions of the user, is mounted on the first circuit surface 111 of the first transparent substrate 11.

The lower insulation ink layer 13 is mounted on an edge portion of the lower touch sensitive layer 12. The lower insulation ink layer 13 has plurality of lower through slots 132 formed through the lower insulation ink layer 13 and covers the edge portion of the lower touch sensitive layer 12. A lower conductive layer 133 is tilled in each lower through slot 132. In the present embodiment, the lower insulation ink layer 13 is made of opaque insulating material, such as opaque black ink or opaque white ink, and is formed on the first circuit surface 111 of the first transparent substrate 11 such that, the edge portion of the lower touch sensitive layer 12 is partial covered using printing and baking technique. The materials of the lower insulation ink layer 13 can be chosen from thermal post curing insulating ink or UV-curing insulting ink. The lower conductive layer 133 adopts a conductive matter having a color identical to or different from that of the lower insulation ink layer 13. The materials of the lower conductive layer 133 may be chosen from conductive silver paste or conductive carbon paste, and the color of the lower conductive layer 133 may be black, red, or white. The lower conductive layer 133 may be filled by one of the methods: printing or photolithography.

The lower conductor layer 14 includes a plurality of signal lines 142 mounted on the lower insulation ink layer 13, and one end of each signal line is electrically connected to the corresponding lower touch sensitive layer 12 through the lower conductive layer 133 for transmitting the touch sensing, signals to a controller (not shown). The lower conductor layer 14 may be made of silver glue or carbon glue by using lithography, printing, inkjet, or other methods known in the art.

The lower insulation layer 15 is mounted on the lower conductor layer 14 to prevent the lower conductor layer 14 from being oxidized due to exposure to air. The lower insulation layer 15 has a lower indentation 151 to partially expose the lower conductor layer 14. In the present embodiment, the lower insulation layer 15 is made of a transparent insulation material, such as post curing material or UV-curing material.

The lower conductive adhesive layer 16 is mounted in the lower indentation 151 of the lower insulation layer 15 to cover the exposed portion of the lower conductor layer 14. In the present embodiment, the lower conductive adhesive layer is formed of anisotropic conductive film (ACF) and/or anisotropic conductive paste (ACP).

Upon fabricating the capacitive touch panel in accordance with the first embodiment of the present invention, a lower panel fabrication process completing the first transparent substrate 11, the lower touch sensitive layer 12, the lower insulation ink layer 13, the lower conductor layer 14, the lower insulation layer 15 and the lower conductive adhesive layer 16 can be conceived.

The flexible circuit board 20 has a top surface 22 and a bottom surface 21. The flexible circuit board 20 is mounted on the lower conductive adhesive layer 16 and the bottom surface 21 is attached to the lower conductive adhesive layer 16 and extends outwardly beyond the first transparent substrate 11. The flexible circuit board 20 is electrically connected to the lower touch sensitive layer 12 through the lower conductive adhesive layer 16, the low conductor layer 14 and the lower conductive layers 133 in the lower through slots 132 of the lower insulation ink layer 13.

The transparent insulation adhesive layer 30 has a thick portion 301 and a thin portion 302. The thick portion 301 is mounted on the lower touch sensitive layer 12 and the thin portion 302 is mounted on the lower insulation layer 15. The transparent insulation adhesive layer 30 is made of liquid optical clear adhesive (LOCA), such as UV glue with a viscosity in a range of about 500 cps to 5000 cps.

The upper insulation layer 41 is mounted on the transparent insulation adhesive layer 30 and has an upper indentation 411 to expose the flexible circuit board 20. In the present embodiment, the upper insulation layer 41 is made of a transparent insulation material, such as post curing material or UV-curing material.

The upper conductive adhesive layer 42 is mounted in the upper indentation 411 of the upper insulation layer 41 to contact with the top surface 22 of the flexible circuit board 20. In the present embodiment, the upper conductive adhesive layer 42 is formed of anisotropic conductive film (ACF) and/or anisotropic conductive paste (ACP).

The upper conductor layer 43 is mounted on the upper conductive adhesive layer 42 and the upper insulation layer 41. The upper conductor layer 43 may be made of silver glue and/or carbon glue.

The upper insulation ink layer 44 is mounted on the upper conductor layer 43 and has a plurality of upper through slots 441 formed through the upper insulation ink layer 44. An upper conductive layer 442 is filled in each upper through slot 441 to contact the upper conductor layer 43. In the present embodiment, the upper conductive layer 442 adopts a conductive matter having a color identical to that of the upper insulation ink layer 44 to conceal the upper through slots 441. In the present embodiment, the upper insulation ink layer 44 is made of opaque insulating material, such as opaque black ink or opaque white ink. The materials of the upper insulation ink layer 44 may be chosen from conductive silver paste or conductive carbon paste.

The upper touch sensitive layer 45 for sensing touch positions of the user is mounted on the transparent insulation adhesive layer 30 and the edge portion of the upper touch sensitive layer 45 partially covers the upper insulation ink layer 44. The upper touch sensitive layer 45 contacts with the upper conductive layer 442 in the upper through slot 441 of the upper insulation ink layer 44. Accordingly, the upper touch sensitive layer 45 can be electrically connected to the flexible circuit board 20 through the upper conductive layers 442 in the upper through slots 441 of the upper insulation ink layer 44, the upper conductor layer 43 and the upper conductive adhesive layer 42.

The second transparent substrate 46 is mounted on the upper touch sensitive layer 45 and the upper insulation ink layer 44, and has a second circuit surface 461 in contact with the upper touch sensitive layer 45 and the upper insulation ink layer 44. When viewed from a side opposite to the second circuit surface 461 of the second transparent substrate 46, the upper insulation ink layer 44 has a masking effect. Accordingly, the second transparent substrate 46 comprises a viewable region 462 and a neighboring region 464 next to the viewable region 462; the upper insulation ink layer 44 is mounted on the neighboring region 464.

Upon fabricating the capacitive touch panel in accordance with the first embodiment of the present invention, an upper panel fabrication process providing the upper insulation layer 41, the upper conductive adhesive layer 42, the upper conductor layer 43, the upper insulation ink layer 44, the upper touch sensitive layer 45 and the second transparent substrate 46 is achieved.

In one example, the first transparent substrate 11 and the second transparent substrate 46 may be made of a same material or two different materials, such as glass, polymer, other transparent insulation materials, and combinations thereof. That materials may include, but are not limited to, polyethylene terephthalate (PET), polycarbonate (PC), polyether sulfone (PES), triacetyl cellulose (TAC), polymethylmethacrylate (PMMA), polyethylene (PE), polyimide (PI), composite material of polycarbonate (PC) and polymethylmethacrylate (PMMA), and the like. In the present embodiment, the first transparent substrate 11 and the second transparent substrate 46 are glass substrates.

Figure 3A:
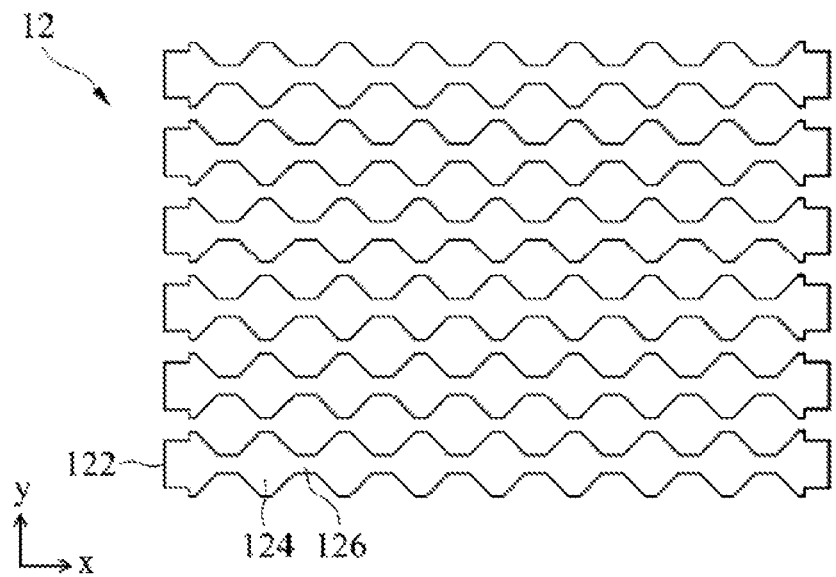
FIG. 3A is a top view of the lower touch sensitive layer of the capacitive touch panel in accordance with the first embodiment of the present invention.
Figure 3B:
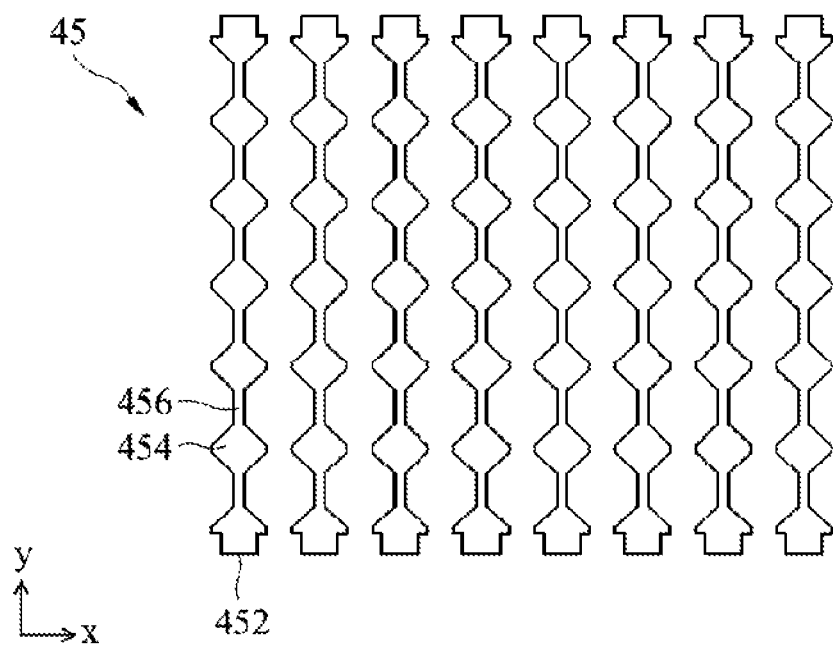
FIG. 3B is a top view of the upper touch sensitive layer of the capacitive touch panel in accordance with the first embodiment of the present invention.

As shown in FIGS. 3A and 3B, the lower touch sensitive layer 12 includes a plurality of first conductive assemblies 122. These assemblies 122 are parallelly arranged in a first direction (such as X-axis). The upper touch sensitive layer 45 includes a plurality of second conductive assemblies 452 parallelly arranged in a second direction (such as Y-axis). In one example, the first conductive assemblies 122 and the second conductive assemblies 452 are arranged perpendicular to each other, forming a matrix structure. Each first conductive assembly 122 includes a plurality of first conductive cells 124, equally spaced along the first direction. Each second conductive assembly 452 includes a plurality of second conductive cells 454, equally spaced along the second direction. The adjacent first conductive cells 124 in the same first conductive assembly are interconnected by a first conductive line 126. Moreover, the adjacent second conductive cells 454 in the same second conductive assembly are interconnected by a second conductive line 456. In one embodiment, the first conductive cells 124 and the second conductive cells 454 are shaped as diamond contour. Other polygon contour, such as hexagon, octagon, rectangle, square, triangle etc., known to a person skilled in the art, can also be used as the shape of the first and second conductive cells 124, 454. The first conductive cells 124 and the second conductive cells 454, for example, are made of transparent conductive material, such as Indium Tim Oxide (ITO), Antimony Tin Oxide (ATO) or Titanium Oxide (TiO2). In one embodiment, the material of the first and second conductive lines 126 and 456 are same as the materials of first and second conductive cells 124, 454. In another embodiment, the material of the first and second conductive lines 126 and 456 are made of gold, silver, copper, aluminum or any other metal materials with good conductivity.

With further reference to FIG. 2, the upper protection layer 51 is bonded to the top surface 22 of the flexible circuit board 20 and a side of the second transparent substrate 46 to protect the flexible circuit board 20 from directly contacting with a side of the second transparent substrate 46 when the flexible circuit board 20 is bent. Therefore, the flexible circuit board 20 is free from cuts and damages that may be caused by the bending of the second transparent substrate 46.

The lower protection layer 52 is bonded to a side portion of the capacitive touch panel between the bottom surface 21 of the flexible circuit board 20 and the first transparent substrate 11 to provide similar protection to the flexible circuit board 20 as the upper protection layer 51 does.

Figure 4:
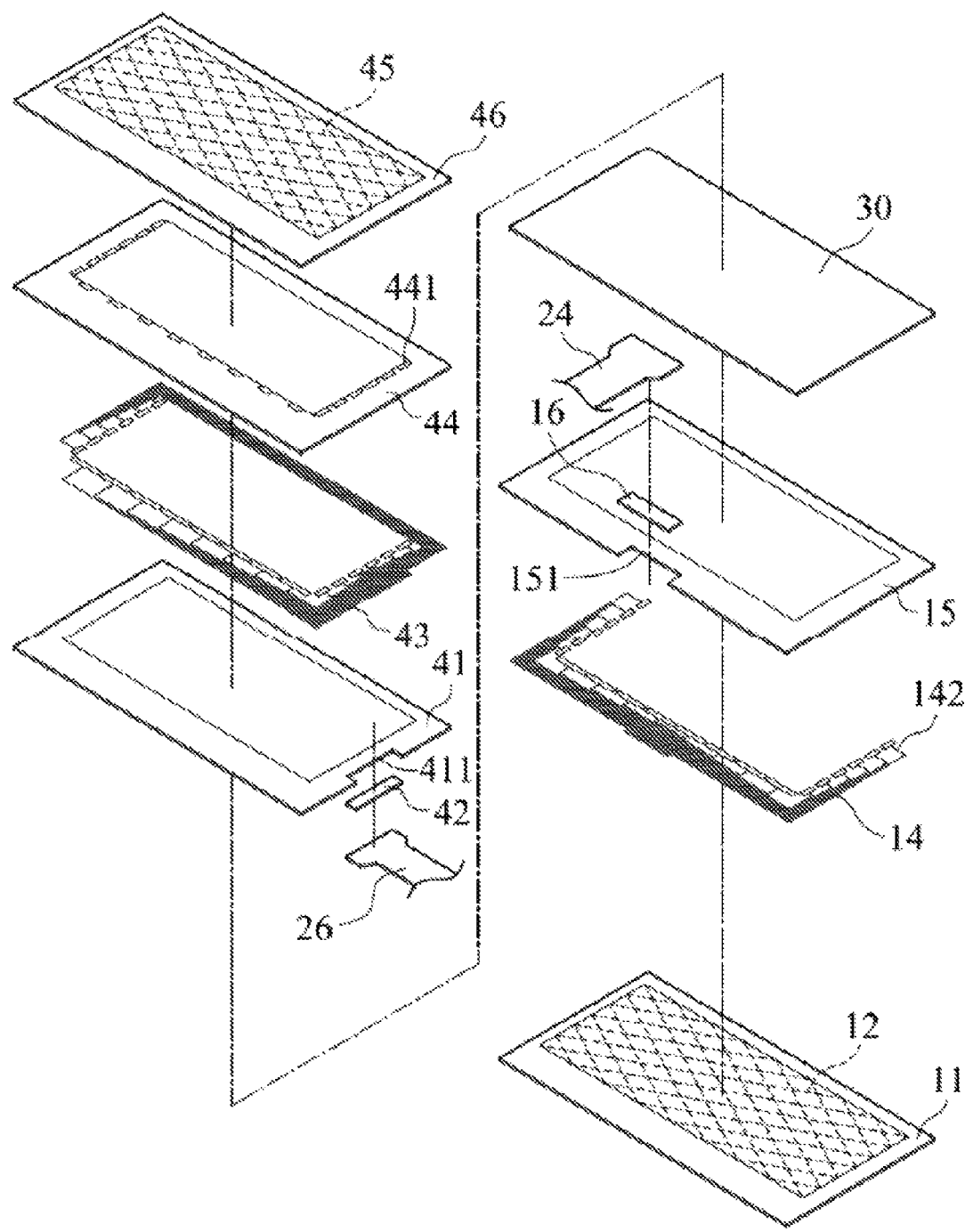
FIG. 4 is an exploded perspective view of a capacitive touch panel in accordance with the second embodiment of the present invention.
Figure 5A:
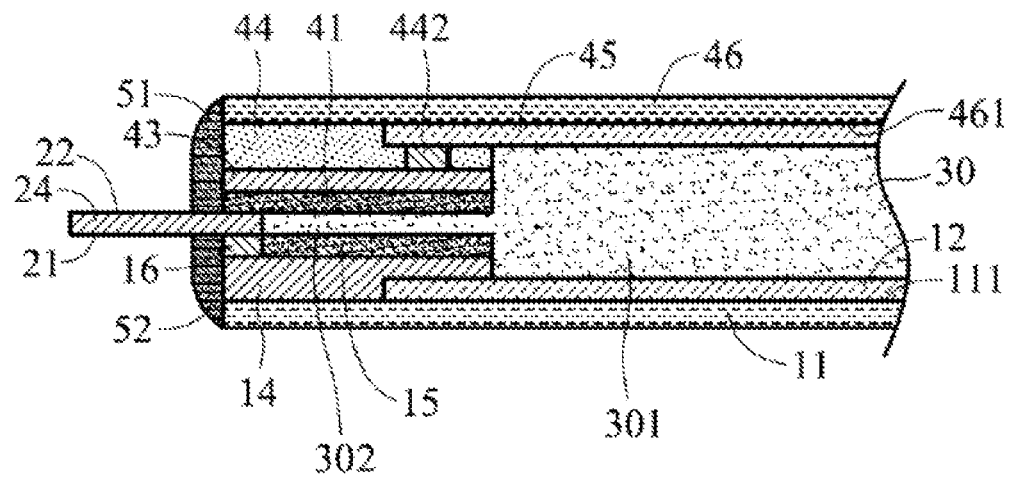
FIGS. 5A and 5B are partial cross-sectional views of the capacitive touch panel in FIG. 4.
Figure 5B:
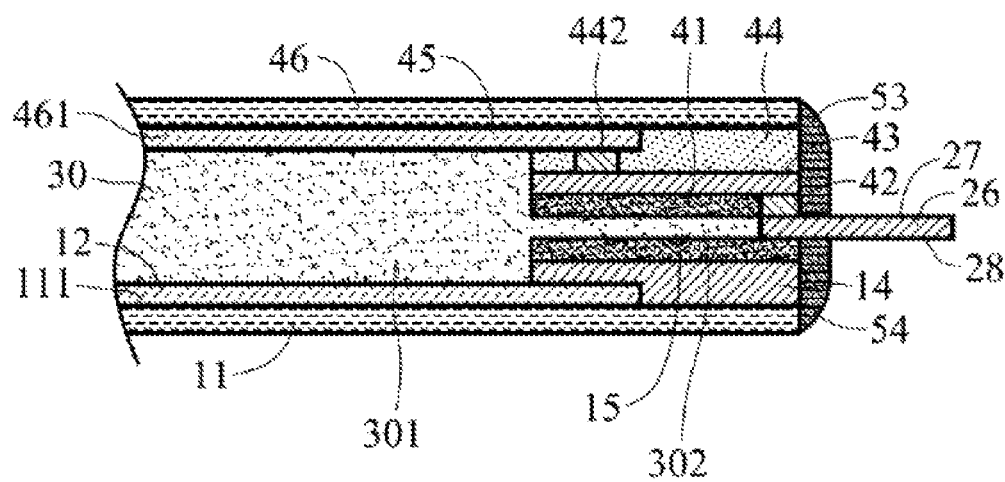
Figure 6:
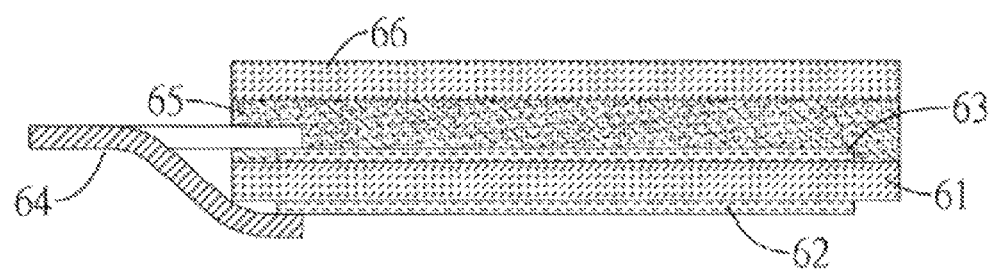
FIG. 6 is a cross-sectional view of a conventional capacitive touch panel.

With reference to FIGS. 4, 5A and 5B, a capacitive touch panel according to a second embodiment of the present invention has a first transparent substrate 11, a lower touch sensitive layer 12, a lower conductor layer 14, a lower insulation layer 15, a lower conductive adhesive layer 16, a lower flexible circuit board 24, a transparent insulation adhesive layer 30, an upper flexible circuit board 26, an upper insulation layer 41, an upper conductive adhesive layer 42, an upper conductor layer 43, an upper insulation ink layer 44, an upper touch sensitive layer 45, a second transparent substrate 46, an upper protection layer 51 and a lower protection layer 52.

A method of fabricating the capacitive touch panel in accordance with the second embodiment of the present invention comprises steps of separately forming a lower panel and an upper panel, respectively mounting a lower flexible board and an upper flexible board on the lower panel and the upper panel, and bonding the lower panel and the upper panel by a transparent insulation adhesive layer. The lower panel fabrication process comprises providing a first transparent substrate 11, forming a lower touch sensitive layer 12, the lower conductor layer 14 the lower insulation layer 15 and the lower conductive adhesive layer 16 on the first transparent substrate 11.

The first transparent substrate 11 has a first circuit surface 111. The lower touch sensitive layer 12, for sensing touch positions of the user, is mounted on the first circuit surface 111 of the first transparent substrate 11.

The lower conductor layer 14, including a plurality of signal lines 142, covers the edge portion of the lower touch sensitive layer 12. The lower conductor layer 14 is electrically connected to the lower touch sensitive layer 12 for transmitting the sensing signals generated by lower touch sensitive layer 12 to a controller. The lower conductor layer 14 may be made of silver glue or carbon glue by using lithography, printing, ink-jet, or other methods known in the art.

The lower insulation layer 15 is mounted on a surface of the lower conductor layer 14 opposite to the lower touch sensitive layer 12 to prevent the lower conductor layer 14 from being oxidized due to exposure to air. The lower insulation layer 15 has a lower indentation 151 to partially expose the lower conductor layer 14. In the present embodiment, the lower insulation layer 15 is made of a transparent insulation material, such as post curing material or UV-curing material.

The lower conductive adhesive layer 16 is mounted in the lower indentation 151 of the lower insulation layer 15 to cover the exposed portion of the lower conductor layer 14. In the present embodiment, the lower conductive adhesive layer is formed of anisotropic conductive film (ACF) and/or anisotropic conductive paste (ACP).

Upon fabricating the capacitive touch panel in accordance with the second embodiment of the present invention, the upper panel fabrication process comprises providing a second transparent substrate 46, forming an upper touch sensitive layer 45, an upper insulation ink layer 44, an upper conductor layer 43, an upper insulation layer 41 and an upper conductive adhesive layer 42 on the second transparent substrate 46.

The second transparent substrate 46 has a second circuit surface 461. The upper touch sensitive layer 45, for sensing touch positions of the user, is mounted on the second circuit surface 461 of the second transparent substrate 46.

The upper insulation ink layer 44 is mounted on an edge portion of the upper touch sensitive layer 45 so that an uncovered portion of the upper touch sensitive layer 45 constitutes a viewable area 134. The upper insulation ink layer 44 has a plurality of upper through slots 441 formed through the upper insulation ink layer 44 and covers the edge portion of the upper touch sensitive layer 45. An upper conductive layer 112 is filled in each upper through slots 441. In the present embodiment, the upper insulation ink layer 11 is made of opaque insulating material, such as opaque black ink or opaque white ink, and the upper insulation ink layer 44 is formed on the second circuit surface 461 of the second transparent substrate 46, wherein the edge portion of the upper touch sensitive layer 45 is partial covered using printing and baking technique. The materials of the upper insulation ink layer 44 can be chosen from thermal post curing insulating ink or UV-curing insulting ink. The upper conductive layer 442 adopts a conductive matter having a color identical to that of the upper insulation ink layer 44 to avoid people easily seeing the upper through slots 441 from the surface opposite to the second circuit surface 461 of the second transparent substrate 46. The materials of the upper conductive layer 442 may be chosen from conductive silver paste or conductive carbon paste, and the color of the upper conductive layer 442 may be black, red, or white. The upper conductive layer 442 may be filled by one of the methods: printing or photolithography.

The upper conductor layer 43 includes a plurality of signal lines 432 mounted on a surface of the upper insulation ink layer 44 opposite to the upper touch sensitive layer 45, and is electrically connected to the upper touch sensitive layer 45 through the upper conductive layer 442 for transmitting the sensing signals to a controller (not shown). The upper conductor layer 43 may be made of silver glue or carbon glue by using lithography, printing, ink-jet, or other methods known in the art.

The upper insulation layer 41 is mounted on a surface of the upper conductor layer 43 opposite to the upper insulation ink layer 44 to prevent the upper conductor layer 43 from being oxidized due to exposure to air. The upper insulation layer 41 has an upper indentation 411 to partially expose the upper conductor layer 43. In the present embodiment, the upper insulation layer 41 is made of a transparent insulation material, such as post curing material or UV-curing material.

The upper conductive adhesive layer 42 is mounted in the upper indentation 411 of the upper insulation layer 41 to cover the exposed portion of the upper conductor layer 43. In the present embodiment, the upper conductive adhesive layer 42 is formed of anisotropic conductive film (ACF) and/or anisotropic conductive paste (ACP).

In the step of mounting a lower flexible board on the lower panel, the lower flexible circuit board 24 has a top surface 22 and a bottom surface 21. The lower flexible circuit board 24 is mounted on the lower panel and the bottom surface 21 is attached to the lower conductive adhesive layer 16 and extends outwardly beyond the first transparent substrate 11. The lower flexible circuit board 24 is electrically connected to the lower touch sensitive layer 12 through the lower conductive adhesive layer 16 and the low conductor layer 14.

In the step of mounting an upper flexible board on the upper panel, the upper flexible circuit board 26 has a top surface 27 and a bottom surface 28. The upper flexible circuit board 26 is mounted on the upper panel and the top surface 27 is attached to the upper conductive adhesive layer 42 and extends outwardly beyond the second transparent substrate 46. The upper flexible circuit board 26 is electrically connected to the upper touch sensitive layer 45 through the upper conductive adhesive layer 42, the upper conductor layer 43 and the upper conductive layers 442 in the upper through slots 442 of the upper insulation ink layer 44.

In the step of bonding the lower panel and the upper panel, the upper panel and the lower panel are bonded by the transparent insulation adhesive layer 30. The transparent insulation adhesive layer 30 is made of liquid optical clear adhesive (LOCA), such as UV glue with a viscosity in a range of about 500 cps to 5000 cps.

With further reference to FIG. 5B, the upper protection layer 53 is bonded to the top surface 27 of the upper flexible circuit board 26 and a side of the second transparent substrate 46 to protect the upper flexible circuit board 26 from directly contacting with a side of the second transparent substrate 46 when the upper flexible circuit board 26 is bent. Therefore, the upper flexible circuit board 26 is free from cuts and damages caused by bending of the second transparent substrate 46.

The lower protection layer 54 is bonded to a side portion of the capacitive touch panel between the bottom surface 28 of the upper flexible circuit board 26 and the first transparent substrate 11 to provide similar protection to the upper flexible circuit board 26 as the upper protection layer 53 does.

In one example, the first transparent substrate 11 and the second transparent substrate 46 may be made of a same material of two different materials, such as glass, polymer, other transparent insulation materials, and combinations thereof. That materials may include, but are not limited to, polyethylene terephthalate (PET), polycarbonate (PC), polyether sulfone (PES), triacetyl cellulose (TAC), polymethylmethacrylate (PMMA), polyethylene (PE), polyimide (PI), composite material of polycarbonate (PC) and polymethylmethacrylate (PMMA), and the like. In the present embodiment, the second transparent substrate 46 is a glass substrate, and the first transparent substrate 11 is a polyethylene terephthalate film. In another embodiment, the second transparent substrate 46 is a polyethylene terephthalate film, and the first transparent substrate is another polymer film.

The lower touch sensitive layer 12 and the upper touch sensing layer 45 in accordance with the second embodiment of the present invention are similar to those of the first embodiment depicted in FIGS. 3A and 3B.

Fabrication of the capacitive touch panel of the present invention can be separated into a lower panel fabrication process and an upper panel fabrication process. According to skill level of the current technology, the yield of using a substrate to fabricate single-sided circuit layer is high. Hence, the structure of the capacitive touch panel of the embodiment of present invention has a better yield than conventional capacitive touch panels in production.

As the yield of the present invention in production is better, the capacitive touch panel of the present invention can be applied to the fabrication of large-size touch panel, thereby achieving a wider application range.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:
1. A capacitive touch panel, comprising:
   a lower panel comprising:
      a first transparent substrate having a first circuit surface;
      a lower touch sensitive layer mounted on the first circuit surface of the first transparent substrate; and
      a lower conductor layer mounted on the first circuit surface of the first transparent substrate and electrically connected to the lower touch sensitive layer;
   an upper panel comprising:
      a second transparent substrate having a second circuit surface;
      an upper touch sensitive layer mounted on the second circuit surface of the second transparent substrate;
      an upper insulation ink layer made of opaque material, mounted on an edge portion of the upper touch sensitive layer, and having a plurality of upper through slots formed through the upper insulation ink layer, wherein each of the plurality of upper through slots is filled in with an upper conductive layer; and
      an upper conductor layer mounted on the upper insulation ink layer and electrically connected to the upper touch sensitive layer via the upper conductive layer; and
   a transparent insulation adhesive layer interposed between the upper panel and the lower panel.

2. The capacitive touch panel as claimed in claim 1, wherein a color of the upper conductive layer is identical to that of the upper insulation ink layer.

3. The capacitive touch panel as claimed in claim 1, wherein the lower panel further comprises a lower insulation layer mounted on the lower conductor layer and having a lower indentation to partially expose the lower conductor layer.

4. The capacitive touch panel as claimed in claim 3, wherein the lower panel further comprises a lower conductive adhesive layer mounted in the lower indentation of the lower insulation layer to cover the exposed portion of the lower conductor layer.

5. The capacitive touch panel as claimed in claim 4, further comprising a flexible circuit board attached to the lower conductive adhesive layer, extending outwardly beyond the first transparent substrate, and electrically connected to the lower touch sensitive layer through the lower conductive adhesive layer.

6. The capacitive touch panel as claimed in claim 5, further comprising an upper protection layer,
wherein the flexible circuit board has a top surface and a bottom surface, wherein the bottom surface is attached to the lower conductive adhesive layer; and
the upper protection layer is bonded to the top surface of the flexible circuit board and a side of the second transparent substrate.

7. The capacitive touch panel as claimed in claim 6, further comprising a lower protection layer bonded to the bottom surface of the flexible circuit board and a side of the first transparent substrate.

8. The capacitive touch panel as claimed in claim 1, wherein the upper panel further comprises an upper insulation layer mounted on the upper conductor layer and having an upper indentation to partially expose the upper conductor layer.

9. The capacitive touch panel as claimed in claim 8, wherein the upper panel further comprises an upper conductive adhesive layer mounted in the upper indentation of the upper insulation layer.

10. The capacitive touch panel as claimed in claim 9, further comprising a flexible circuit board attached to the upper conductive adhesive layer, extending outwardly beyond the second transparent substrate, and electrically connected to the upper touch sensitive layer through the upper conductive adhesive layer.

11. The capacitive touch panel as claimed in claim 1, wherein the upper conductive adhesive layer is formed of at least one chosen from anisotropic conductive film (ACF) and anisotropic conductive paste (ACP).

12. The capacitive touch panel as claimed in claim 1, wherein the first transparent substrate and the second transparent substrate are made of one or more materials selected from a group consisting of glass, polyethylene terephthalate (PET), polycarbonate (PC), polyether sulfone (PES), triacetyl cellulose (TAC), polymethylmethacrylate (PMMA), polyethylene (PE), polyimide (PI), composite material of polycarbonate (PC) and polymethylmethacrylate (PMMA).

13. The capacitive touch panel as claimed in claim 1, wherein the material of the upper insulation ink layer is selected from the group consisting of opaque black ink and opaque white ink.

14. The capacitive touch panel as claimed in claim 1, wherein the upper conductive layer is at least one chosen from conductive silver paste and conductive carbon paste.

15. The capacitive touch panel as claimed in claim 1, wherein the material of the upper touch sensitive layer is selected from the group consisting of Indium Tim Oxide (ITO), Antimony Tin Oxide (ATO) and Titanium Oxide ($TiO_2$).

16. A capacitive touch panel, comprising:
a first transparent substrate having a first circuit surface;
a lower touch sensitive layer mounted on the first circuit surface of the first transparent substrate;
a lower conductor layer mounted on the first circuit surface of the first transparent substrate and electrically connected to the lower touch sensitive layer;
a transparent insulation adhesive layer mounted on the lower touch sensitive layer;
an upper conductor layer mounted on the transparent insulation adhesive layer;
an upper insulation ink layer made of opaque material, mounted on the upper conductor layer, and having a plurality of upper through slots formed through the upper insulation ink layer, wherein each of the plurality of upper through slots is filled in with a upper conductive layer;
an upper touch sensitive layer mounted on the transparent insulation adhesive layer, partially covering the upper insulation ink layer, and electrically connected to the upper conductor layer via the upper conductive layers in the corresponding upper through slots of the upper insulation ink layer; and
a second transparent substrate mounted on the upper touch sensitive layer and the upper insulation ink layer and having a second circuit surface in contact with the upper touch sensitive layer and the upper insulation ink layer.

17. The capacitive touch panel as claimed in claim 16, wherein a color of the upper conductive layer is identical to that of the upper insulation ink layer.

18. The capacitive touch panel as claimed in claim 16, further comprising a lower insulation layer, wherein the lower insulation layer is mounted on one surface of the lower conductor layer and the lower touch sensitive layer is mounted on the other surface of the lower conductor layer and the lower insulation layer has a lower indentation to partially expose the lower conductor layer.

19. The capacitive touch panel as claimed in claim 18, further comprising a lower conductive adhesive layer mounted in the lower indentation of the lower insulation layer to cover the exposed portion of the lower conductor layer.

20. The capacitive touch panel as claimed in claim 19, further comprising a flexible circuit board attached to the lower conductive adhesive layer, extending outwardly beyond the first transparent substrate, and electrically connected to the lower touch sensitive layer through the lower conductive adhesive layer.

21. The capacitive touch panel as claimed in claim 20, further comprising an upper protection layer, wherein
the flexible circuit board has a top surface and a bottom surface, wherein the bottom surface is attached to the lower conductive adhesive layer; and
the upper protection layer is bonded to the top surface of the flexible circuit board and a side of the second transparent substrate.

22. The capacitive touch panel as claimed in claim 21, further comprising a lower protection layer bonded to the bottom surface of the flexible circuit board and a side of the first transparent substrate.

23. The capacitive touch panel as claimed in claim 16, further comprising an upper insulation layer, wherein the upper insulation layer is mounted on one surface of the upper conductor layer and the upper touch sensitive layer is mounted on the other surface of the upper conductor layer and the upper insulation layer has an upper indentation to partially expose the upper conductor layer.

24. The capacitive touch panel as claimed in claim 23, further comprising an upper conductive adhesive layer mounted in the upper indentation of the upper insulation layer.

25. The capacitive touch panel as claimed in claim 24, further comprising a flexible circuit board attached to the upper conductive adhesive layer, extending outwardly beyond the second transparent substrate, and electrically connected to the upper touch sensitive layer through the upper conductive adhesive layer.

26. The capacitive touch panel as claimed in claim 24, wherein the upper conductive adhesive layer is formed of at least one chosen from anisotropic conductive film (ACF) and anisotropic conductive paste (ACP).

27. The capacitive touch panel as claimed in claim 16, wherein the first transparent substrate and the second transparent substrate are made of one or more materials selected from a group consisting of glass, polyethylene terephthalate (PET), polycarbonate (PC), polyether sulfone (PES), triacetyl cellulose (TAC), polymethylmethacrylate (PMMA), polyethylene (PE), polyimide (PI), composite material of polycarbonate (PC) and polymethylmethacrylate (PMMA).

28. The capacitive touch panel as claimed in claim 16, wherein the material of the upper insulation ink layer is selected from the group consisting of opaque black ink and opaque white ink.

29. The capacitive touch panel as claimed in claim 16, wherein the upper conductive layer is at least one chosen from conductive silver paste and conductive carbon paste.

30. The capacitive touch panel as claimed in claim 16, wherein the material of the upper touch sensitive layer is selected from the group consisting of Indium Tim Oxide (ITO), Antimony Tin Oxide (ATO) and Titanium Oxide (TiO$_2$).

* * * * *